(12) United States Patent
Shi et al.

(10) Patent No.: US 7,014,738 B2
(45) Date of Patent: Mar. 21, 2006

(54) ENHANCED MACROPARTICLE FILTER AND CATHODE ARC SOURCE

(75) Inventors: Xu Shi, Singapore (SG); Beng Kang Tay, Singapore (SG); Hong Siang Tan, Selangor (MY)

(73) Assignee: Filplas Vacuum Technology PTE Ltd., Singapore (SG)

( * ) Notice: Subject to any disclaimer, the term of this patent is extended or adjusted under 35 U.S.C. 154(b) by 46 days.

(21) Appl. No.: 10/342,335

(22) Filed: Jan. 15, 2003

(65) Prior Publication Data

US 2003/0155230 A1   Aug. 21, 2003

Related U.S. Application Data

(63) Continuation-in-part of application No. 09/530,009, filed as application No. PCT/IB98/01764 on Oct. 26, 1998, now Pat. No. 6,511,585.

(30) Foreign Application Priority Data

Oct. 24, 1997   (GB) .................................... 9722645

(51) Int. Cl.
   *C23C 14/32*   (2006.01)
(52) U.S. Cl. .............................. 204/192.38; 204/298.41
(58) Field of Classification Search ........... 204/192.38, 204/298.41
   See application file for complete search history.

(56) References Cited

U.S. PATENT DOCUMENTS

| | | | |
|---|---|---|---|
| 3,913,520 A | 10/1975 | Berg et al. .................... 118/679 |
| 4,352,044 A | 9/1982 | Zhukov et al. .......... 315/111.21 |
| 4,392,931 A * | 7/1983 | Maniv et al. .......... 204/192.12 |
| 4,645,895 A * | 2/1987 | Boxman et al. .......... 219/76.13 |
| 4,917,786 A | 4/1990 | Ehrich .................... 204/192.38 |
| 5,013,578 A | 5/1991 | Brown et al. ................ 427/455 |
| 5,254,237 A | 10/1993 | Snaper et al. .......... 204/298.41 |
| 5,279,723 A | 1/1994 | Falabella et al. ...... 204/192.38 |
| 5,435,900 A * | 7/1995 | Gorokhovsky ......... 204/298.41 |
| 5,458,754 A | 10/1995 | Sathrum et al. ....... 204/192.38 |

FOREIGN PATENT DOCUMENTS

EP   0 265 365   4/1988

(Continued)

OTHER PUBLICATIONS

European Patent Office, Patent Abstracts of Japan; Publication No. 02251143; Publication Date Oct. 8, 1990.
European Patent Office, Patent Abstracts of Japan, Publication No. 63125655; Publication Date May 28, 1988.
Derwent WPI, English language abstract of Japanese Patent No. 63-114199, Publication Date May 19, 1988.
International Search Report of International Application No. PCT/IB98/01764, mailed Jul. 21, 1999.

*Primary Examiner*—Rodney G. McDonald
(74) *Attorney, Agent, or Firm*—Sterne, Kessler, Goldstein & Fox, P.L.L.C.

(57) ABSTRACT

A cathode arc source for depositing a coating on a substrate has an anode and a cathode station for a target, a first filter means comprising a filter duct having at least one bend, and first magnetic means for steering plasma through the filter duct for removal of macroparticles from the plasma. The apparatus comprises a second filter (10) for further removal of macroparticles from the plasma, made up of a baffle (11), an aperture (12) through which plasma can pass and second magnetic means (13) for steering plasma through the aperture. The aperture size may be less than 33% of the duct sectional area at that point. The source can also include an ion beam generator. Also described is a method of depositing coatings of ions using the second filter and closing the aperture in the filter when required.

31 Claims, 9 Drawing Sheets

FOREIGN PATENT DOCUMENTS

| | | |
|---|---|---|
| EP | 0 583 473 A1 | 2/1994 |
| WO | WO 92/16959 | 10/1992 |
| WO | WO 95/29272 | 11/1995 |
| WO | WO 96/26531 | 8/1996 |

* cited by examiner

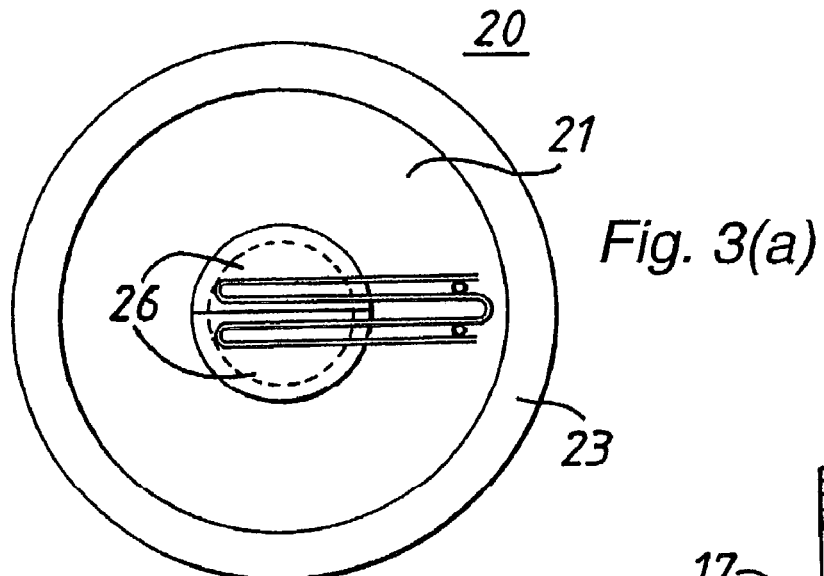
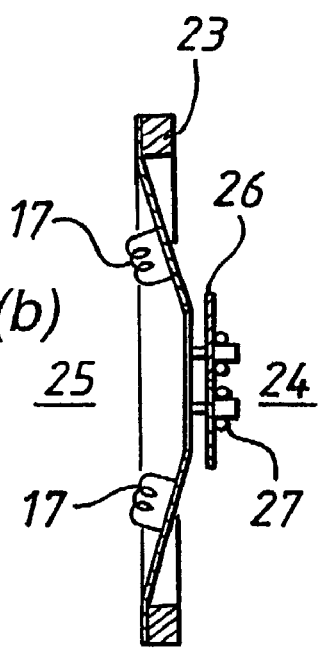
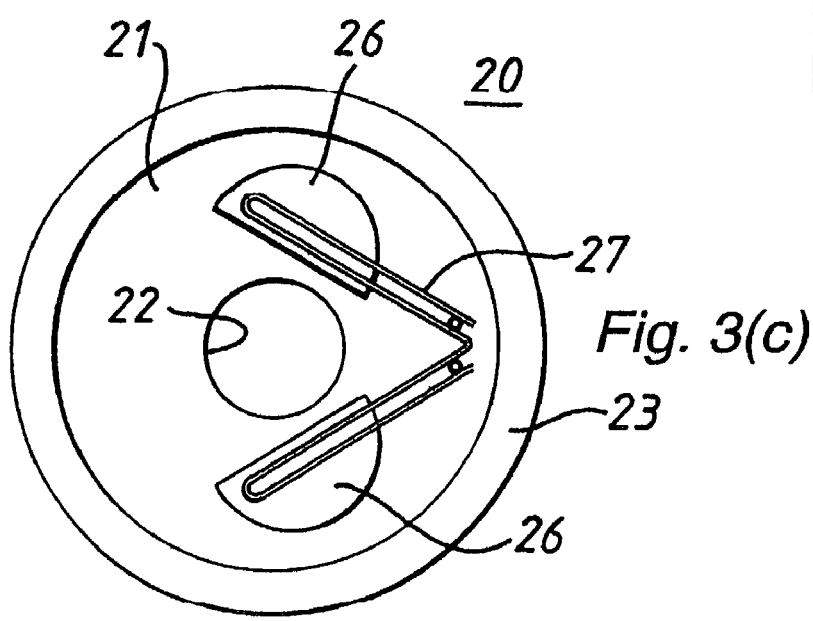

ENHANCED MACROPARTICLE FILTER AND CATHODE ARC SOURCE

CROSS-REFERENCE TO RELATED APPLICATIONS

This application is a continuation-in-part of allowed U.S. application Ser. No. 09/530,009, now U.S. Pat. No. 6,511,585, filed Oct. 6, 2000 which is a U.S. National Phase of International Application No. PCT/IB98/01764, filed Oct. 26, 1998, which is incorporated herein by reference in its entirety.

BACKGROUND OF THE INVENTION

Field of the Invention

The present invention relates to deposition of coatings using a cathode arc source, to filtering of macroparticles from plasma in a cathode arc source, in particular using a magnetically enhanced macroparticle filter, and to substrate preparation prior to deposition and to control of deposition.

Cathode arc deposition of tetrahedral amorphous carbon, metallic, dielectric and other such coatings are known in the art and offer the potential for deposition of thin films of high quality. Applications in scratch resistant optical coatings and hard disc media coatings are but two of a wide range of proposed uses.

Hitherto, deposition of films by the cathode arc process has been limited to laboratory use, in general because of difficulties in the art in reliably depositing films that are free of or have acceptably low contamination by macroparticles—large, neutral particles.

Provision of improved means for filtering macroparticles from the arc plasma have recently been described in WO-A-96/26531 and also in International patent application no. PCT/GB97/01992. Nevertheless, further improvements in filtering of macroparticles is desirable and will become more so as further applications for the deposited films arise.

The present inventors have identified problems with deposition of thin films using arc plasma, namely that the initial period of deposition can give a poor quality coating; it would therefore be desirable to avoid deposition using the plasma first emitted after striking an arc at a target. Likewise, the final period of deposition while the plasma density is falling, just before breakdown of the arc, can also give poor quality coatings, and it would be desirable to avoid deposition at this time. Known filtered cathode arc sources do not however have such a facility.

It is vital in some applications to be able to provide an accurate thickness of coating and to stop deposition when the desired thickness has been achieved. However, there is a period of seconds after shutting down the arc during which there is a small residual amount of deposition—this can lead to a slightly greater coating thickness than is wanted. Existing apparatus does not enable deposition to be stopped suddenly.

Tetrahedral amorphous carbon coatings laid down using filtered cathode arc apparatus can be liable to tear or peel away from a substrate and, in an attempt to avoid or reduce this, pretreatment of the substrate to clean the surface that will receive the coating is optional, but can hitherto only be carried out either in apparatus separate from the deposition apparatus or in deposition apparatus incorporating an ion beam source in addition to a cathode arc source. The former inconveniently introduces an extra step into production of coatings, unattractive from a commercial point of view, as well as requiring two separate machines. Deposition apparatus with their own ion beam source are expensive as the ion beam source is a separate attachment to the chamber.

The present invention seeks to provide for further filtering of arc plasma and to overcome or at least ameliorate problems encountered with prior art cathode arc sources. It is therefore an object of the invention to provide method and apparatus for filtering macroparticles from plasma in a cathode arc source. A further object is to facilitate deposition of coatings on substrates that have been pretreated to promote adhesion of the coating thereto.

SUMMARY OF THE INVENTION

Accordingly, a first aspect of the invention provides a cathode arc source for depositing a coating on a substrate, said source comprising:

an anode and a cathode station for a target, a first filter means comprising a filter duct having at least one bend, and first magnetic means for steering plasma through the filter duct for removal of macroparticles from the plasma;

wherein the apparatus comprises a second filter for further removal of macroparticles from the plasma, the second filter comprising a baffle, an aperture through which plasma can pass and second magnetic means for steering plasma through the aperture.

An advantage of the apparatus of the invention is that further filtering of macroparticles is provided which can result in further improvements in the quality of films, such as tetrahedral amorphous carbon films, deposited from the cathode arc source. The aperture is preferably closeable. The first aspect of the invention also provides the second filter in isolation from the rest of the apparatus.

In an embodiment of the invention, the second filter is located between the duct of the first filter and the substrate. In use, plasma containing positive ions and being contaminated by macroparticles is steered around the bend of the first filter and a proportion of macroparticles hit the side of the filter duct and are removed from the plasma. At the end of the duct closest to the substrate, that is to say after the plasma has passed through the bend, there is a relatively high density of the remaining macroparticles towards the outside of the duct. The plasma is however more dense in terms of positive ions towards the centre of the duct. The second filter of the invention thus is effective because its baffle is located towards the outside of the duct and thus macroparticles towards the outside of the duct hit the baffle and are prevented from travelling further towards the substrate.

A preferred embodiment of the source of the invention thus comprises a first filter duct attached to a chamber in which plasma is deposited on a substrate, wherein the second filter means is located at or near the exit of the filter duct and exerts its filtering effect before the plasma reaches the chamber.

It is further preferred that the second filter means is in the approximate form of a disc having a substantially circular aperture. As plasma in the duct is denser towards the duct centre and can be steered through a circular aperture this is a convenient configuration of the aperture to obtain high transmission of plasma through the second filter whilst filtering macroparticles from the plasma. The aperture shape may additionally be at least partially dictated by the cross-section of the filter duct. If this were not circular but oval-shaped, then an oval-shaped aperture or an aperture varying from circular might be appropriate.

A typical filter of the invention extends across the width of the filter duct. Macroparticles that hit the baffle of the disc fall back onto the side of the duct away from the substrate; after a period of use it will be preferred to clean the duct and/or the disc in this area, though a major part of the filtering is achieved by the first bend of the duct and consequently cleaning of the filter disc will not often be necessary.

In an embodiment of the invention shown in an example below, the filter disc is a substantially planar and circular disc of steel foil with a central aperture. In another embodiment of the invention shown in another example below the filter disc is not planar but comprises a baffle angle to deflect macroparticles away from the plasma. An advantage of this embodiment is that the purpose of the baffle it to reduce the number of macroparticles that reach the substrate. Some macroparticles when stopped by the baffle may be deflected into the plasma beam and thereafter carried towards the substrate by the plasma momentum. A baffle that is inclined to the plasma so as to deflect macroparticles away from the plasma and towards the side of the duct is thus a preferred component of the filter.

Generally, the disc should be thin and should not interfere with operation of the filter duct and should not interfere with the magnetic field that steers plasma through the filter duct. Typically, the disc is less than 2 mm thick, and is preferably less than 1 mm thick.

The aperture in the filter is for passage of plasma therethrough and may be less than 33% of the internal sectional area of the filter duct at that point, preferably less than 25% of the duct internal sectional area, i.e. for a circular aperture in a circular duct, less than 50% of the internal width of the filter duct. Good results have been achieved using a filter having an aperture size of less than 16% duct sectional area, i.e. about 40% the width of the duct. More preferably, the aperture size is less than 9% duct sectional area and most preferably still, an aperture size of less than 5% duct sectional area is used. The aperture will be designed according to its particular application and different sizes may be appropriate according to the position of the filter, the size of the filter duct and the type of material that is being laid down in a coating. If the radius of the first bend of the filter duct is sharp the density of macroparticles towards the outside of the duct may be higher, as macroparticles are not bent around the bend by the magnetic steering field, in which case a smaller baffle and a larger aperture may be suitable.

Table 1 below shows the relationship between filter aperture size and percentage internal sectional area of the filter duct for a 150 mm (6 inch) or a 200 mm (8 inch) double bend filter.

| Aperture Size | % Duct Sectional Area 150 mm (6 inch) duct | % Duct Sectional Area 200 mm (8 inch) duct |
| --- | --- | --- |
| 35 mm | 5.4% | 3% |
| 45 mm | 9% | 5% |
| 60 mm | 16% | 9% |
| 80 mm | 28.4% | 16% |

Plasma density generally increases towards the centre of the duct and thus only a small proportion of plasma is blocked by the action of the second filter. Even so, it is preferred that the apparatus comprises one or a plurality of permanent magnets for providing a local magnetic field around the second filter to steer plasma away from the baffle and through the aperture. This is of advantage in that the proportion of plasma passing through the filter is increased whilst the steering field does not directly increase the passage of macroparticles through the aperture of the filter. By use of a magnetic steering field in addition to and separate from that used to guide plasma around the bend of the filter duct a magnetic field locally enhanced in the region of the second filter is provided to pinch plasma through the aperture, which may as a result be made smaller whilst allowing substantially all plasma to pass. A reduction in size of the aperture further increases the filtering of macroparticles from the beam.

Permanent magnetics offer the advantage that no electrical connection need be made from outside the duct into a coil or coils located within the duct. Alternatively, the apparatus comprises an electromagnetic coil for providing a local field around the second filter, adapted for connection to an external power supply.

In use, the magnetic field around the second filter may have a strength in the range of 100 to 200 Gauss, though a stronger field strength may be appropriate if increased filtering is required and may then facilitate a further reduction of the filter aperture.

It is optional for the second filter to be composed of a baffle plate that is located only on one side of the duct. The filter of this embodiment is thus not a disc having a hole or aperture but a plate; plasma is steered around the plate by a locally enhanced magnetic field and macroparticles hitting the plate are thereby prevented from reaching the substrate.

Further embodiments of the invention relate to rapid control of deposition and to substrate preparation. Accordingly, a particular apparatus of the invention additionally comprises a shutter associated with the second filter for opening and closing of the aperture. Operation of the shutter between a closed and an open position respectively stops and starts deposition during use of the cathode arc source. Deposition can be stopped and started at precise times, and rapidly. To avoid deposition during the period immediately after arc striking the shutter can be closed initially and then opened after plasma quality has reached a predetermined level or after a predetermined time. This feature of the invention can thus offer improved control over the deposition process.

The shutter is optionally controlled manually by handle means extending from the shutter outside the filter duct. The shutter may also be controlled by an actuator in operative combination with controlling circuitry of the cathode source and adapted to close the shutter in response to certain predetermined states of the arc. One such state may be a drop in plasma quality. Another may be a drop in plasma density.

A shutter described specifically below comprises two substantially semi-circular halves adapted for movement across the aperture between retracted positions away from the aperture and closed positions in which they meet in front of and obscure the aperture. The particular shutter described is water-cooled.

A yet further particular embodiment of the invention lies in a cathode arc source for depositing a coating on a substrate, said source comprising:

an anode and a cathode station for a target, a first filter means comprising a filter duct having at least one bend, and first magnetic means for steering plasma through the filter duct for removal of macroparticles from the plasma;

wherein the apparatus comprises a second filter for further removal of macroparticles from the plasma, comprising a baffle, an aperture through which plasma can pass and second magnetic means for steering plasma through the aperture, further comprising means in a deposition chamber for generating an ion beam and directing said beam at the substrate.

A still further particular embodiment of the invention lies in a cathode arc source for depositing a coating on a substrate, said source comprising an anode and a cathode station for a target, a first filter means comprising a filter duct having at least one bend, and first magnetic means for steering plasma through the filter duct for removal of macroparticles from the plasma;

wherein the apparatus comprises a second filter for further removal of macroparticles from the plasma, comprising a baffle, an aperture through which plasma can pass and second magnetic means for steering plasma through the aperture, wherein the second filter comprises means for generating an ion beam and directing said beam at the substrate.

Cleaning of the substrate prior to deposition or other surface treatment of the substrate prior to deposition can thus be easily and conveniently carried out using these embodiments of the invention. An ion beam in the chamber or associated with the second filter can be operated before beginning to deposit a coating. Another possibility is to use the ion beam between laying down different layers in a multi-layer coating.

The ion beam generating means is suitably of the "end-hall" ion beam type, and may comprise one or a plurality of electric filaments. A specific second filter of the invention comprises a plurality of filaments for generating electrons for an ion beam source, located substantially evenly spaced around the aperture of the filter. A source of gas, such as Argon, is located at or near the second filter.

The invention also provides a method of filtering macroparticles from a beam of plasma emitted from a cathode arc source, the method comprising:

steering the beam through a first filter comprising a filter duct having at least one bend; and steering the beam thereafter through a second filter comprising a baffle and an aperture through which plasma can pass.

A preferred method is one comprising steering the beam through the second filter by steering the beam using a magnetic field locally increased in strength around the second filter. Thus plasma is preferentially steered around and to avoid the baffle whereas a proportion of macroparticles, not being so steered, hit the baffle and are deflected away from and prevented from reaching the substrate.

A further aspect of the invention provides a method of depositing a coating on a substrate using deposition apparatus comprising a cathode arc source, the method comprising:

positioning the substrate in a deposition chamber of the apparatus, directing at the substrate an ion beam, and depositing on the substrate a coating of positive ions emitted in a plasma from the cathode arc source.

The ion beam may be generated from ion beam generating means located inside the deposition chamber.

In another embodiment of the invention the apparatus comprises a filter duct between the deposition chamber and the cathode arc source, and wherein the ion beam is generated from an ion beam generating means located in the filter duct, at or near the exit of the duct into the chamber. A shutter is conveniently located in the filter duct and the method may then comprise the steps of closing the shutter, directing an ion beam at the substrate, opening the shutter and depositing a coating of positive ions on the substrate.

The invention still further provides a method of depositing a coating on a substrate using deposition apparatus comprising a cathode arc source, the method comprising:

depositing on the substrate a coating of positive ions emitted in a plasma from the cathode arc source, monitoring the thickness of the coating, and when the thickness has reached a predetermined level, moving a shutter across the plasma so as to prevent further deposition of plasma on the substrate.

The invention still further provides a method of depositing a coating on a substrate using deposition apparatus comprising a cathode arc source having an anode and a cathode target for emission of a plasma containing positive ions and a filter duct for filtering of macroparticles from the plasma, the method comprising moving a shutter across the filter duct so as to prevent deposition of plasma on the substrate, striking an arc between the anode and the target, determining when plasma quality has reached a predetermined level, or waiting a predetermined period of time, and opening the shutter so as to allow deposition of plasma on the substrate.

A still further aspect of the invention provides apparatus for generating plasma for deposition upon a substrate, said apparatus comprising a first cathode arc source, a second cathode arc source and a main plasma duct, wherein plasma output from the first cathode arc source is guided into the main duct via a first side duct connected to the main duct, plasma output from the second cathode arc source is guided into the main duct via second side duct connected to the main duct, and wherein a single plasma is output from the main duct of the apparatus.

During operation of the apparatus, if plasma is being generated from both the first and second cathode arc sources, the plasma outputs are combined in the main duct to form a single plasma output for deposition onto a substrate. Alternatively, the first and second cathode arc sources can be operated independently of each other, so that one arc source is in use at a time, e.g. whilst the other is being serviced.

The apparatus offers the advantage that increased rate of deposition can be achieved using both sources simultaneously with their outputs combined. The apparatus also offers the advantage that multi-layer coatings can be provided by operating a first source with a target of one material and the second source with a target of a different material. One example is to operate a first source with a silicon target and a second source with a graphite target.

The apparatus comprises magnetic field generating means, such as an electromagnet or a permanent magnet, to guide plasma output from the respective sources via the side ducts into the main duct. The apparatus further preferably comprises magnetic field generating means located below the target in each source so as to provide a point of zero normal field strength above the target and strong lateral field at the surface of the target as the resultant of the field below the target and the guiding field, which are of opposite direction.

In a preferred embodiment of the invention, the main duct is substantially linear with one end attached to or opening into or otherwise in communication with a deposition chamber, and the side ducts are attached to the main duct substantially opposite each other. A view port or a monitor of deposited film thickness can be conveniently located at the end of the main duct opposite to the end connected to a deposition chamber. This is an advantageous arrangement in that there is a line-of-sight directly from that end of the main duct to the substrate. This is illustrated for example in a specific embodiment of the invention discussed below and shown in FIG. 5.

It is further preferred that, for deposition of coatings that comprise oxide, the apparatus is adapted for introduction of argon gas into the main duct, via inlet port in the main duct and/or in the side ducts, whilst oxygen is introduced into the deposition chamber. A port is optionally provided in the main duct so that argon gas can be introduced at an end of the main duct proximal to the deposition chamber and pumped out distal to the deposition chamber so as to maintain a partial pressure of argon in the main duct sufficient to reduce entry of oxygen into the main duct and from there into the side ducts where the anodes of the sources are, whereby oxide contamination of target material is reduced. This argon partial pressure may optionally be at least around $10^{-4}$ torr. With an oxygen partial pressure in the deposition chamber of about $10^{-2}$–$10^{-3}$ torr oxygen is largely prevented from entering the main duct by such a partial pressure of Argon, is consequently largely prevented from entering side ducts and therefore there is minimum contamination of the cathode arc source by build up of oxide on the anode surface.

It is also preferred that the cathode arc sources are shielded from external magnetic fields, such as the guiding fields, by the use of a shroud of material having high magnetic permeability. Iron and the so-called "$\mu$-metals" are suitable. It is an option to operate the apparatus without using the "reversing" field located at or below the target so long as the cathode arc sources are shielded from excessive influence by the guiding field required to guide the plasma output towards the substrate.

In another embodiment of this aspect of the invention, the main plasma duct comprises at least a single bend for filtering of macroparticles from the plasma. The bend angle is optionally 30–90°. Apparatus of this aspect of the invention can be combined with a deposition chamber so that a substrate can be coated simultaneously on both its front and rear surfaces. Thus, a deposition apparatus may comprise a deposition chamber to two sides of which are attached apparatus according to this aspect of the invention.

BRIEF DESCRIPTION OF THE DRAWINGS/FIGURES

The invention is now illustrated with reference to drawings in which:

FIGS. 1(a) and (b) show a schematic front view and a schematic cross-section of a filter disk according to the invention;

FIGS. 2(a), (b) and (c) show schematic views of a filter disk of the invention in first and second positions and a schematic cross-section of the filter in a first position;

FIGS. 3(a), (b) and (c) show schematic views of a filter disk of the invention in first and second positions and a schematic cross-section of the filter in a first position;

FIGS. 4(a), (b) and (c) show images of films obtained, respectively, by prior art techniques, using a double bend as described in WO-A-96/26531 and, finally, using a magnetically enhanced filter according to the present; and FIG. 5 shows a schematic cross-section of a deposition apparatus of the present invention comprising two cathode arc sources.

DETAILED DESCRIPTION OF THE INVENTION

Figure 1A:
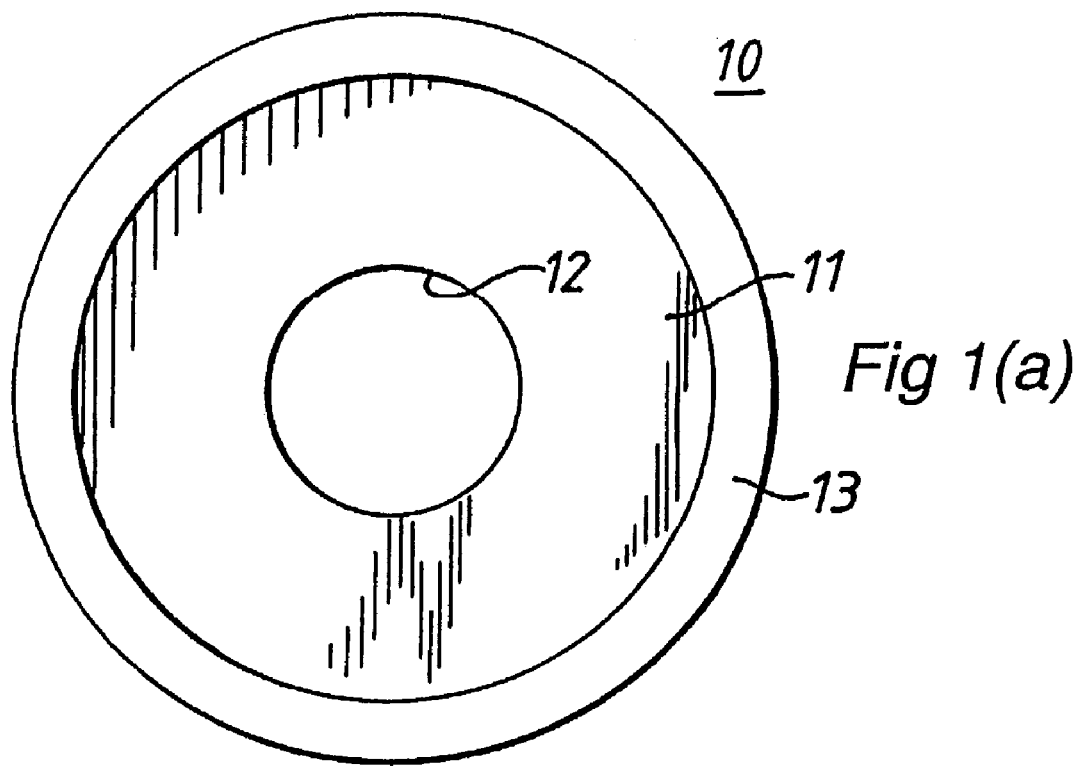
Figure 1B:
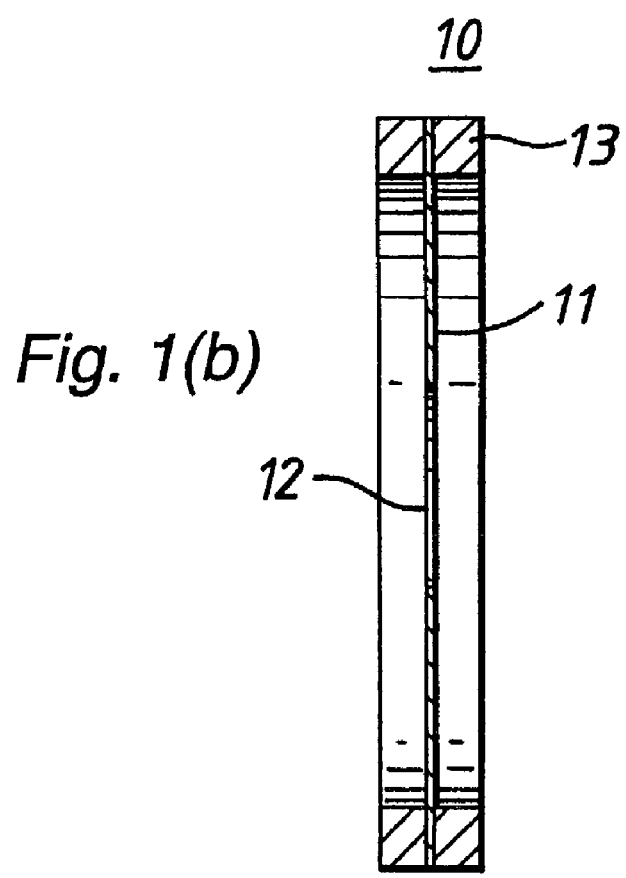

Referring to FIGS. 1(a) and (b), a filter disk is shown generally as 10 and is made of stainless steel foil less than 1 mm thick. The filter comprises a baffle 11 and an aperture 12. A permanent ring-magnet 13 (or an electro-magnet 13) is located around the periphery of the disk and in use provides a locally enhanced magnetic field so as to steer plasma through the aperture 12, allowing neutrally charged macroparticles to hit the baffle 11 and travel no further towards the substrate. FIG. 1(b) shows a schematic cross section of the disk illustrated in FIG. 1(a). The aperture 12 is normally in the size range 10 to 50 mm for use in a filter duct having an internal diameter of about 100 mm.

Figure 2A:
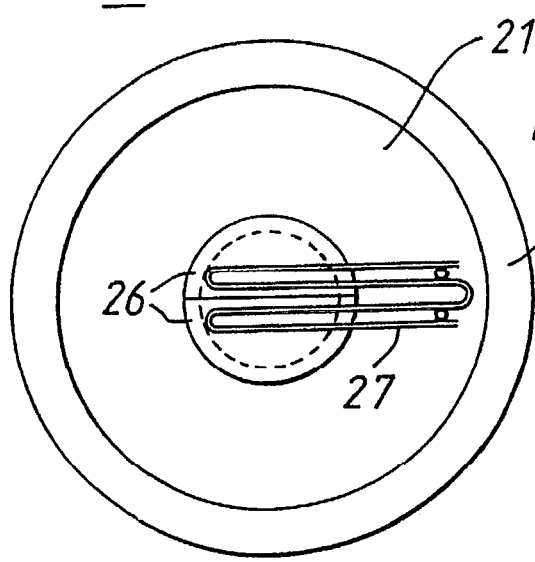
Figure 2B:
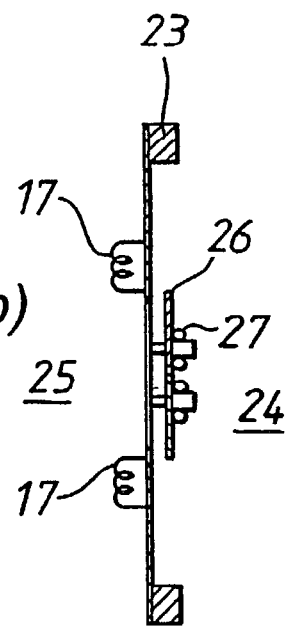

Referring to FIGS. 2(a), (b) and (c) and FIGS. 3(a), (b) and (c), a filter disk of the invention is shown generally as 20 and comprises a baffle 21 and aperture 22. A circular permanent magnet 23 (or electromagnet 23) is located at the periphery of the filter disk and provides a locally enhanced magnetic field to steer plasma through the aperture. As discussed above, the locally enhanced magnetic field can also be provided by an electromagnet.

Figure 2C:
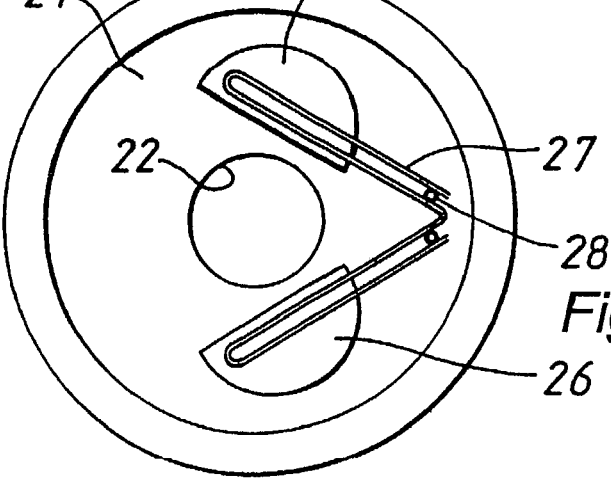

The embodiments of the invention shown in these two figures include a shutter composed of shutter portions 26 which when in a closed position, shown in FIGS. 2(a) and 3(a), closes the aperture 22, and when moved to an open position, shown in FIGS. 2(c) and 3(c) allows a plasma beam emitted from the cathode arc source to pass through the aperture and reach the substrate. The shutter portions 26 are made also of steel and are cooled by flow of water through cooling pipes 27. In the arrangements shown, the cooling pipes are attached to the shutter portions and mounted for pivotal movement on pivots 28. A handle for opening and closing of the shutter by an operator is attached, but not shown in these figures. The shutter with cooling pipes attached is located on duct side 24 of the apparatus and not on chamber side 25. If the shutter is made of graphite then the cooling pipes can be omitted.

An ion beam attachment, for generation of an ion beam for cleaning the substrate prior to deposition or for carrying out other ion beam treatments of the substrate surface is optionally attached to or associated with the filter disk, usually located on the chamber side 25 of the filter disk assembly.

When the ion beam attachment is working, a filament or filaments 17 attached to the chamber side 25 provide electrons and permanent or magnet 23 provide the magnet field necessary for the electrons to start and sustain the plasma discharge on the chamber side. The disk 20 is positively biased (typically up to +150V) to act as the anode and the shutter is closed, acting as the reflector (with a floating voltage). Thus, an ion beam is generated and directed towards the chamber. The disc design shown in FIG. 3(b) is preferred in this respect as it produces a slightly more focused ion beam. The ion beam source is thus of the "end hall" type.

Use of the magnetically enhanced filter of the invention has been tested by the inventors and a film has been deposited using the magnetically enhanced filter and compared with films obtained via prior art techniques.

Figure 4A:
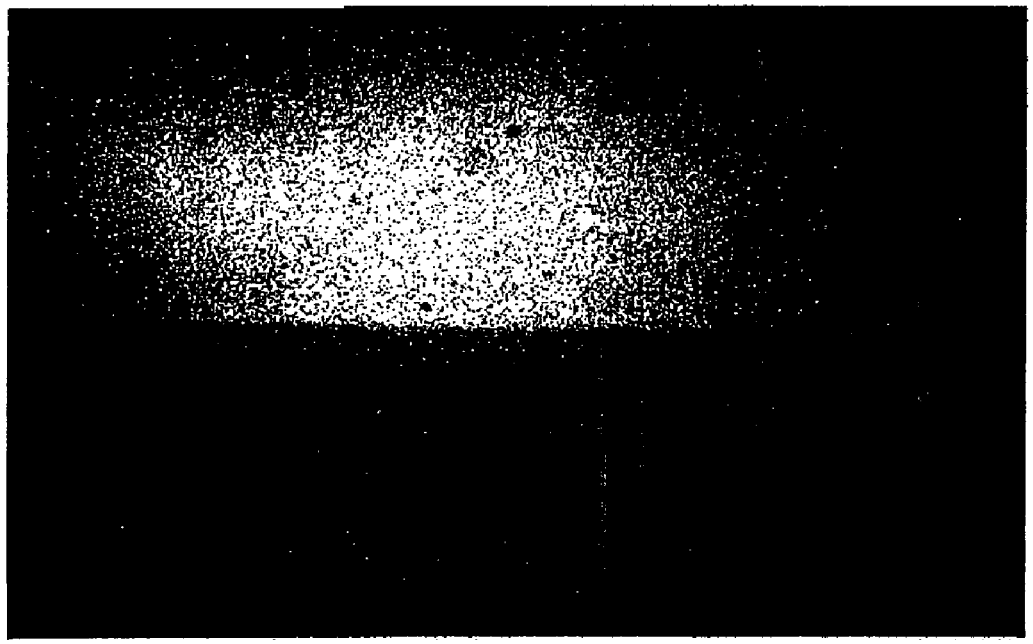

The results are shown in FIGS. 4(a), (b) and (c).

FIG. 4(a) shows a film deposited using prior art techniques. The dark blemishes are large, neutrally-charged macroparticles contaminating the film. They are seen to be numerous in this prior art film.

Figure 4B:
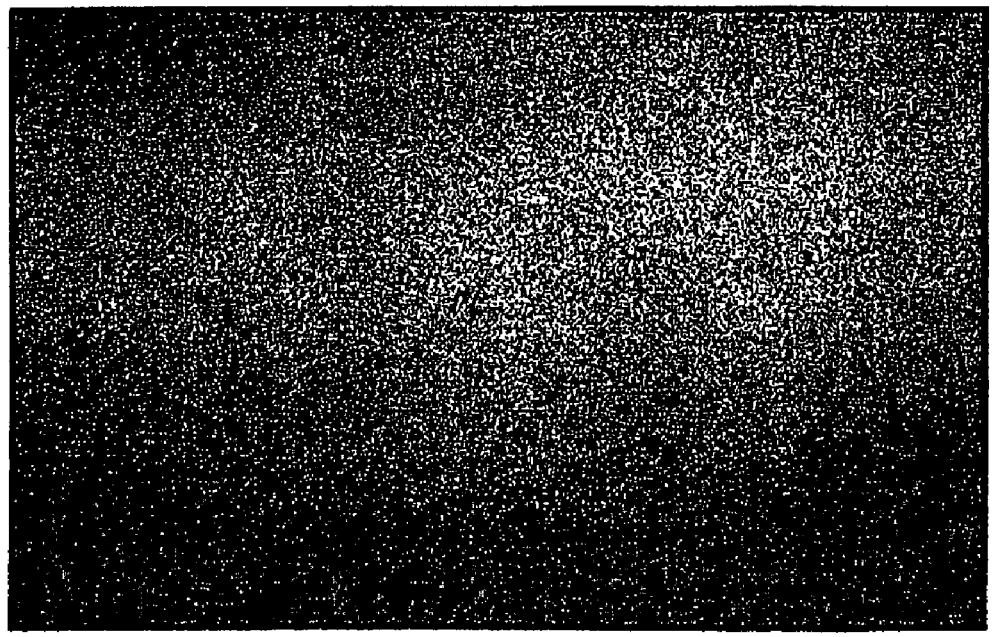

FIG. 4(b) shows the film deposited using a double bend filter duct as described in WO-A-96/26531, with reduced contamination by macroparticles, though nevertheless with a number of macroparticles visible.

Figure 4C:
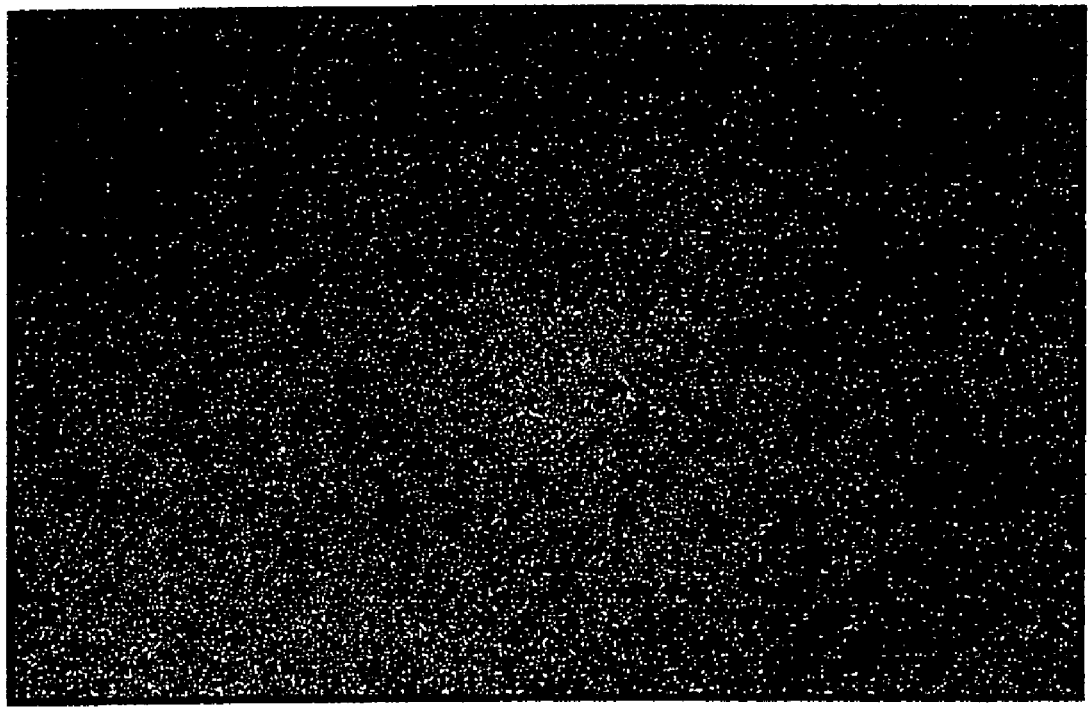

Lastly, FIG. 4(c) shows a film deposited using deposition apparatus having a double bend filter duct and a magnetically enhanced filter according to the invention. Fewer macroparticles are seen in this deposited film and in the area of film shown there are no macroparticles.

Figure 5:
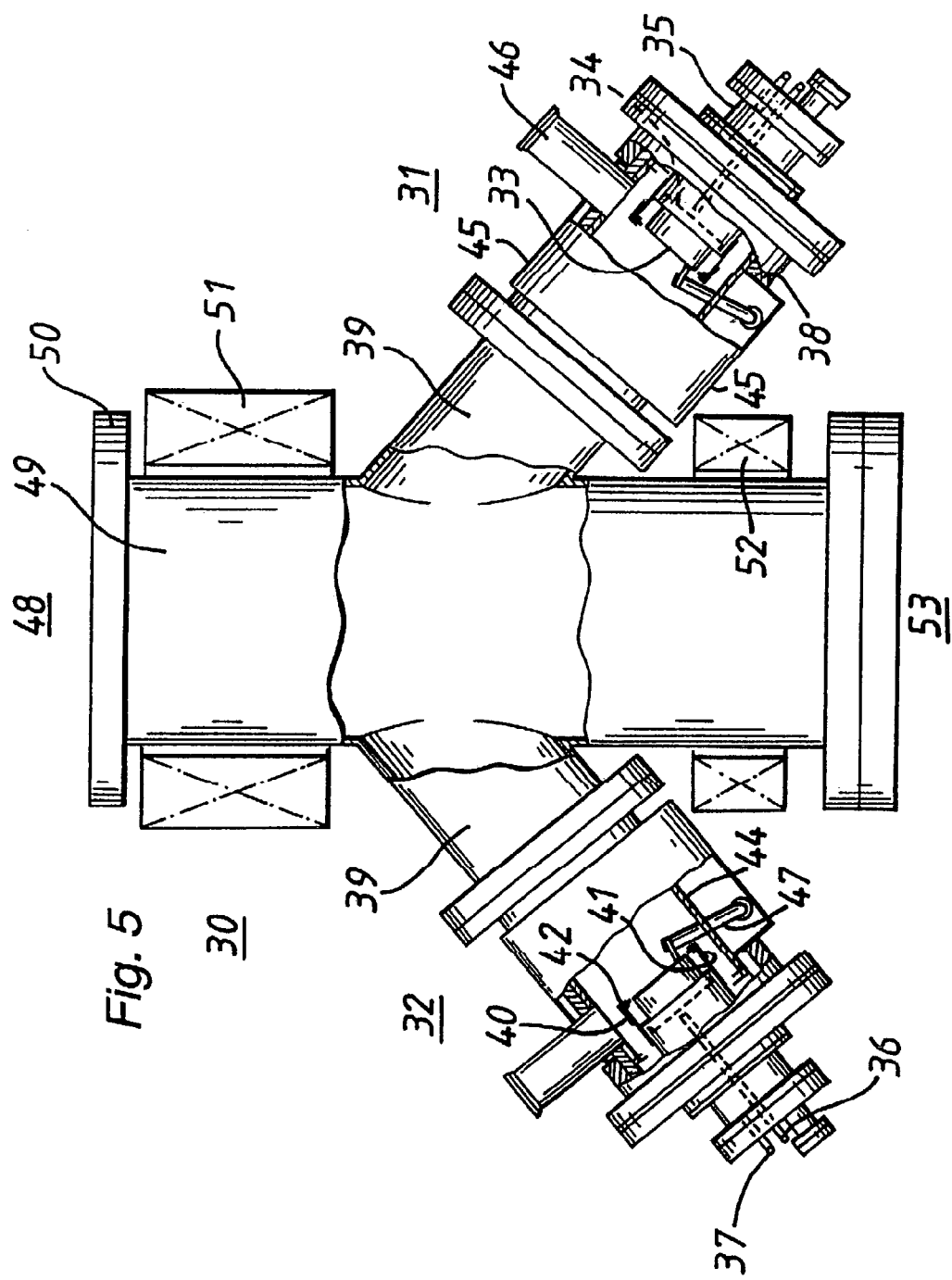

Referring to FIG. 5, deposition apparatus shown generally as 30 comprises two cathode arc sources 31 and 32. Each cathode arc source comprises a target 33, in electrical contact with a target plate 34 and a cathode body 35. The combination of a target plate 34 and a cathode body 35 are also referred to as a cathode station—ie for location of a cathode target thereon and electrical connection to the arc power supply.

In use, cooling of the target is achieved via flow of cooling water into the inlet 36 and exiting via the outlet 37.

A so-called "reversing field" is provided by permanent magnet 38 mounted around and below the lower part of the target. The permanent 38 may optionally be replaced by an electromagnet. Magnets or coils for a guiding field to guide plasma from the target towards a substrate are not shown but are located around the side ducts 39.

Around the target 33 is provided a shield composed of a shield body 40, a ceramic circle 41 and shield cap 42. An anode liner is fitted tightly inside and in electrical contact with anode wall 44. Cooling is provided by flow of water through the cooling water housing 45 and observation of the arc is through view port 46. A linear striker 47 is provided for arc striking.

The deposition apparatus comprises a chamber, not shown, which is at position 48 attached to main duct 49 by flange 50. Guiding of plasma towards a substrate in the chamber is achieved by conventional magnetic fields generated by guiding field coil 51 and enhancing field coil 52. The guiding field within the main duct is typically of strength between 400 and 1000 Gauss, while the guiding field within the side ducts is typically of strength between 200 and 600 Gauss, with the magnets providing the fields being conveniently arranged so as to provide a continuous guiding field through the side duct, into the main duct and onto a substrate in a deposition chamber.

The fields can alternatively be generated by permanent magnets. The main duct 49 and its coils or other magnets and the side ducts and its guiding coil or magnets are optionally shrouded by a shroud, not shown, of material of high magnetic permeability—iron or $\mu$-metals are suitable. The effect of the shroud is to reduce the influence of the guiding fields on the field at and around the target.

In the embodiment illustrated, the diameter of the side ducts is about 15 cm (6 inches) and that of the main duct is about 20 cm (8 inches). Other diameters can also be adopted though the diameters of the side ducts will conveniently be less than that of the main duct.

At position 53 may be mounted one or more of a viewport, an ion beam source, a monitor of the thickness of the film deposited on the substrate and a pumping port. Flange 50 may also comprise or be part of a valve for isolation of the main and side ducts from the chamber 48 for the purpose of servicing the sources. A pumping port is then used to evacuate the main and side ducts before reopening this valve. The apparatus can also include a magnetically enhanced filter according to the invention, located so as to filter macroparticles in the main duct, or in the side ducts, or both.

Figure 6:
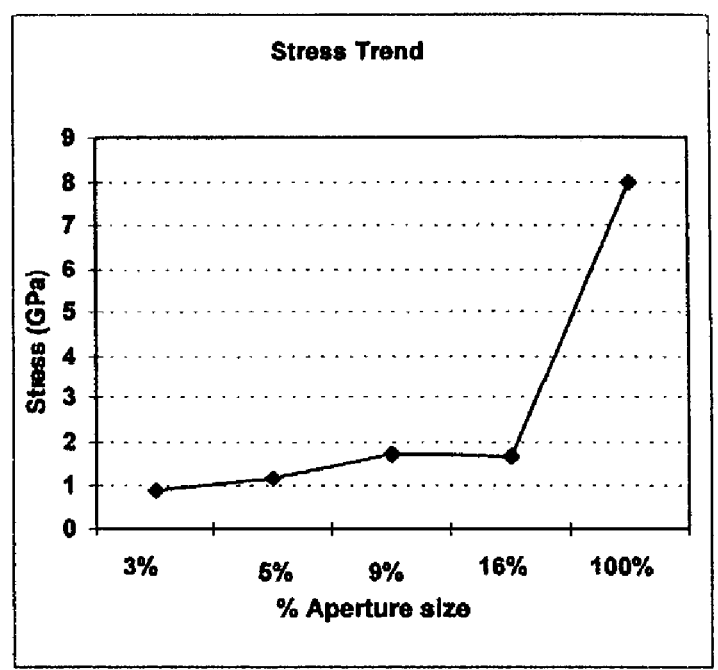
FIG. 6 shows the relationship between aperture size in the second filter (% sectional area of the filter duct) and stress of a ta-C film.

Referring to FIG. 6, the size of the aperture in the second filter affects the stress of the film deposited on the substrate. Reduced stress is advantageous as it allows thicker films to be deposited and allows deposition on flexible substrates. The graph shows stress versus filter aperture size (expressed as a % of the duct sectional area) for a 200 mm (8 inch) duct. Without the filter (100% opening) the typical stress for ta-C film is 8 GPa. Use of a filter having an 80 mm aperture (16% duct sectional area) reduces the stress to less than 2 Gpa. The stress can be as low as 1 GPa when the filter aperture is 35 mm or 3% duct sectional area in a 200 mm (8 inch) duct.

Figure 7:
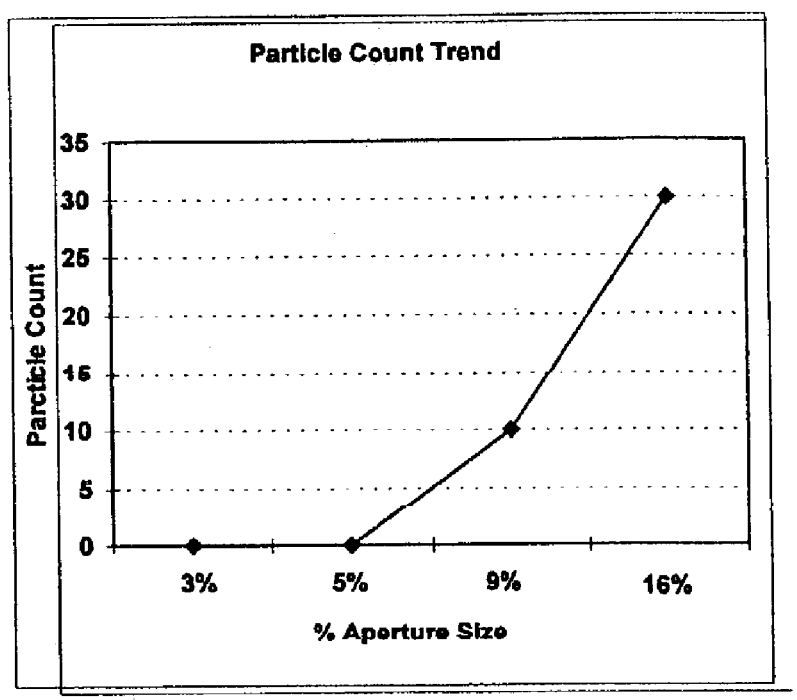
FIG. 7 shows the relationship between aperture size in the second filter (% sectional area of the filter duct) and macroparticle count at the substrate.

FIG. 7 shows the relationship between the quantity of macroparticles reaching the substrate versus the filter aperture size, in the range 3–16% duct sectional area (35–80 mm in a 200 mm (8 inch) duct). It can be seen that macroparticle count reduces steadily to about zero macroparticles as filter aperture size is reduced from 16–5% duct sectional area. No further reduction in the macroparticle count in achieved by reducing the filter aperture size below 5% duct sectional area.

Figure 8:
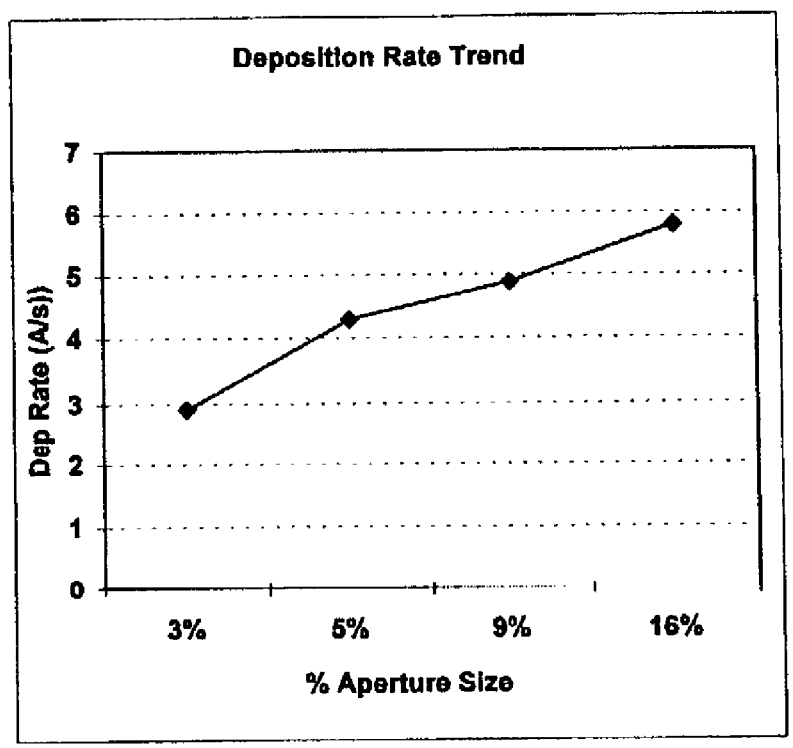
FIG. 8 shows the relationship between aperture size in the second filter (% sectional area of the filter duct) and deposition rate.

Referring to FIG. 8, a slight reduction in the deposition rate (A/s) can be seen with decreasing aperture size, over a range of 16–3% duct sectional area, in an 8 inch duct. The rate of reduction of deposition is slow, however, compared to the rate of reduction in macroparticle count over this aperture size-range (compare FIGS. 7 and 8). There is also little change in the stress of the film over this aperture size-range.

This data shows the advantages in relatively small aperture sizes in accordance with the invention and that, where particle-free coating is essential, the optimum aperture size will be about 5% duct sectional area, for a 200 mm (8 inch) duct. This aperture size combines an acceptable level of deposition with very low macroparticle count and low stress of the deposited film.

The invention thus offers the possibility further to reduce the contamination of films deposited using cathode arc source techniques, even with a conventional duct filter, to provide improved control over the deposition process and to provide and facilitate ion beam treatment of the substrate before, during or after the deposition process.

What is claimed is:

1. A cathode arc source for depositing a coating on a substrate, said source comprising:
    an anode and a cathode station for a target; and
    a first filter comprising a filter duct having at least one bend and first magnetic means for steering plasma through the bend of the filter duct for removal of macroparticles from the plasma,
    wherein the apparatus further comprises a second filter located between the duct of the first filter and the substrate, for further removal of macroparticles from the plasma and comprising a baffle, an aperture through which plasma can pass and second magnetic means to provide a magnetic field locally enhanced in the region of the second filter for steering plasma through the aperture, and wherein the aperture in the second filter has an opening of less than 33% of the internal sectional area of the filter duct.

2. The cathode arc source of claim 1, wherein the aperture in the second filter has an opening of less than 25% of the internal sectional area of the filter duct.

3. The cathode arc source of claim 1, wherein the aperture in the second filter has an opening of less than 16% of the internal sectional area of the filter duct.

4. The cathode arc source of claim 1, wherein the aperture in the second filter has an opening of less than 9% of the internal sectional area of the filter duct.

5. The cathode arc source of claim 1, wherein the aperture in the second filter has an opening of less than 5% of the internal sectional area of the filter duct.

6. The cathode arc source of claim 2 wherein the filter duct is attached to a chamber in which plasma is deposited on the substrate, and wherein the second filter is located at the exit of the filter duct.

7. The cathode arc source of claim 2 wherein the second filter is a baffle in the form of a filter disc having a substantially circular aperture.

8. The cathode arc source of claim 7 wherein the disc extends across the width of the filter duct.

9. The cathode arc source of claim 7 wherein the disc is less than 2 mm thick.

10. The cathode arc source of claim 2 further comprising one or a plurality of permanent magnets for providing a local magnetic field around the second filter to steer plasma away from the baffle and through the aperture.

11. The cathode arc source of claim 2 further comprising one or a plurality of electromagnets adapted for connection to a power supply for providing a local magnetic field around the second filter to steer plasma away from the baffle and through the aperture.

12. The cathode arc source of claim 10 wherein the magnetic field provided around the second filter has a strength in the range of 100 to 200 Gauss.

13. The cathode arc source of claim 2 wherein the second filter further comprises a shutter for opening and closing of the aperture.

14. The cathode arc source of claim 2 further comprising means in a deposition chamber for generating an ion beam and directing said beam at the substrate.

15. The cathode arc source of claim 2 wherein a source of gas is located at the second filter.

16. A method of filtering macroparticles from a beam of plasma emitted from a cathode arc source, the method comprising:
using a magnetic field to steer the beam through a first filter comprising a filter duct having at least one bend; and
steering the beam thereafter through a second filter comprising a baffle and an aperture wherein a magnetic field is provided that is locally enhanced in the region of the second filter so as to steer the beam through the aperture,
wherein the aperture in the second filter has an opening of less than 33% of the internal sectional area of the filter duct.

17. The method of claim 16, wherein the aperture in the second filter has an opening of less than 25% of the internal sectional area of the filter duct.

18. The method of claim 16, wherein the aperture in the second filter has an opening of less than 16% of the internal sectional area of the filter duct.

19. The method of claim 16, wherein the aperture in the second filter has an opening of less than 9% of the internal sectional area of the filter duct.

20. The method of claim 16, wherein the aperture in the second filter has an opening of less than 5% of the internal sectional area of the filter duct.

21. A filter for use in a deposition apparatus having a cathode arc source, a filter duct and a deposition chamber, the filter comprising:
a baffle plate having an aperture therethrough; and
magnetic field generating means for guiding plasma from the cathode arc source through the aperture,
wherein the aperture in the filter has an opening of less than 33% of the internal sectional area of the filter duct.

22. The filter of claim 21, wherein the aperture in the filter has an opening of less than 25% of the internal sectional area of the filter duct.

23. The filter of claim 21, wherein the aperture in the filter has an opening of less than 16% of the internal sectional area of the filter duct.

24. The filter of claim 21, wherein the aperture in the filter has an opening of less than 9% of the internal sectional area of the filter duct.

25. The filter of claim 21, wherein the aperture in the filter has an opening of less than 5% of the internal sectional area of the filter duct.

26. The filter of claim 22, wherein the baffle plate is substantially circular and the aperture is substantially circular and centrally located.

27. The filter of claim 26, further comprising permanent magnets.

28. An apparatus for generating plasma for deposition upon a substrate, said apparatus comprising:
a main plasma duct,
a first cathode arc source,
a first side duct connected to said main plasma duct,
a second cathode arc source; and
a second side duct connected to said main plasma duct,
wherein plasma output from the first cathode arc source is guided by magnetic field into the main plasma duct via the first side duct and plasma output from the second cathode arc source is guided by magnetic field into the main plasma duct via the second side duct,
wherein the main plasma duct provides a single plasma output from the apparatus, and
wherein the first and second side ducts each comprise a filter comprising a baffle plate having an aperture therethrough, and magnetic field generating means for guiding plasma from the respective cathode arc source through the aperture, wherein the aperture in the filter has an opening of less than 25% of the internal sectional area of the respective side duct.

29. An apparatus for generating plasma for deposition upon a substrate, said apparatus comprising:
a main plasma duct,
a first cathode arc source,
a first side duct connected to said main plasma duct,
a second cathode arc source; and
a second side duct connected to said main plasma duct,
wherein plasma output from the first cathode arc source is guided by magnetic field into the main plasma duct via the first side duct and plasma output from the second cathode arc source is guided by magnetic field into the main plasma duct via the second side duct,
wherein the main plasma duct provides a single plasma output from the apparatus, and wherein the main plasma duct comprises a filter comprising a baffle plate having an aperture therethrough, and magnetic field generating means for guiding plasma from one of the cathode arc sources through the aperture, wherein the aperture in the filter has an opening of less than 25% of the internal sectional area of the main plasma duct.

30. A method of depositing a coating on a substrate, comprising:

outputting a first plasma beam from a first cathode arc source;

guiding said first plasma beam through a first side duct into a main duct;

outputting a second plasma beam from a second cathode arc source;

guiding said second plasma beam through a second side duct into the main duct;

in the main duct, combining said first and second plasma beams to form a combined beam; and guiding the combined beam onto the substrate, wherein said first and second side ducts each comprise a filter comprising a baffle plate having an aperture therethrough, and magnetic field generating means for guiding plasma from the respective cathode arc source through the aperture, wherein the aperture in the filter has an opening of less than 25% of the internal sectional area of the respective side duct.

31. A method of depositing a coating on a substrate, comprising:

outputting a first plasma beam from a first cathode arc source;

guiding said first plasma beam through a first side duct into a main duct;

outputting a second plasma beam from a second cathode arc source;

guiding said second plasma beam through a second side duct into the main duct;

in the main duct, combining said first and second plasma beams to form a combined beam; and guiding the combined beam onto the substrate, wherein said main duct comprises a filter comprising a baffle plate having an aperture therethrough, and magnetic field generating means for guiding plasma from the cathode arc sources through the aperture, wherein the aperture in the filter has an opening of less than 25% of the internal sectional area of said main duct.

* * * * *